(12) United States Patent  
Wimpenny

(10) Patent No.: US 8,669,745 B2
(45) Date of Patent: Mar. 11, 2014

(54) TRANSFORMER BASED VOLTAGE COMBINER WITH INDUCTIVE SHUNT

(75) Inventor: Gerard Wimpenny, Cambourne (GB)

(73) Assignee: Nujira Limited, Cambridge (GB)

( * ) Notice: Subject to any disclaimer, the term of this patent is extended or adjusted under 35 U.S.C. 154(b) by 616 days.

(21) Appl. No.: 12/919,668

(22) PCT Filed: Feb. 27, 2009

(86) PCT No.: PCT/EP2009/052410
§ 371 (c)(1),
(2), (4) Date: Dec. 17, 2010

(87) PCT Pub. No.: WO2009/106631
PCT Pub. Date: Sep. 3, 2009

(65) Prior Publication Data
US 2011/0084680 A1   Apr. 14, 2011

(30) Foreign Application Priority Data
Feb. 29, 2008 (GB) .................................. 0803821.8

(51) Int. Cl.
G05F 1/10 (2006.01)
(52) U.S. Cl.
USPC .......................................... 323/247; 323/356
(58) Field of Classification Search
USPC ................. 323/234, 247, 355, 356, 359
See application file for complete search history.

(56) References Cited

U.S. PATENT DOCUMENTS

2007/0126411 A1*  6/2007  Gibellini ........................ 323/356
2011/0084680 A1*  4/2011  Wimpenny ..................... 323/305

FOREIGN PATENT DOCUMENTS

| GB | 1024235 | | 3/1966 | |
| GB | 1181262 A | | 2/1970 | |
| GB | 2409115 | * | 6/2005 | .............. H01F 38/36 |
| WO | 2007078158 A1 | | 7/2007 | |

OTHER PUBLICATIONS

Watt, John, "GB Application No. 0803821.8 Examination Report Nov. 28, 2011",, Publisher: UK IPO, Published in: GB.

(Continued)

Primary Examiner — Jeffrey Sterrett
(74) Attorney, Agent, or Firm — Kaplan, Breyer, Schwarz & Ottesen, LLP

(57) ABSTRACT

In accordance with the invention there is also provided a voltage combiner comprising: a transformer having a first and second winding each having a first and second tap; and an inductor connected between the first and second taps of the second winding, wherein: the first tap of the first winding is adapted for connection to a first voltage, the first tap of the second winding is adapted for connection to a second voltage, and the second tap of the second winding is adapted to provide an output being the first and second voltages combined, and further wherein: the inductor is adapted to provide a bypass path for the current associated with the second voltage.

20 Claims, 6 Drawing Sheets

(56) References Cited

OTHER PUBLICATIONS

Timothy C. Neugebauer et al., "Parasitic capacitance cancellation in filter inductors", "2004 IEEE 35th Annual Aachen, Germany Jun. 20-25, 2004", pp. 4102-4107, Publisher: IEEE Conference. PESC 04, XP010739399, Published in: Piscataway, NJ, USA.

Anderson D R et al., "High-efficiency high-level modulator for use in dynamic envelope tracking CDMA RF power amplifiers", "2001 IEEE MTT-S international Microwave Symposium Digest. (IMS 2001). Phoenix, AZ, May 20-25, 2001", pp. 1509-1512, Publisher: IEEE, XP001067507, Published in: New York, NY, US.

Caliskan V et al, "Design and evaluation of feedforward active ripple filters", "IEEE Transactions on Power Electronics", Mar. 1, 2005, pp. 276-285, vol. 20, No. 2, Publisher: IEEE Service Center, XP011128519, Published in: Piscataway, NJ, US.

"British Search Report for International Application No. GB 0803821.8", May 20, 2009, Publisher: Intellectual Property Office / British Patent Office, Published in: South Wales.

Chow A C et al, "Design and evaluation of an active ripple filter using voltage injection", "32nd Annual IEEE Power Electronics Specialists Conference. PESC 2001. Conference Proceedings. Vancouver, Canada", Jun. 17, 2001, pp. 390-397, vol. 1, Publisher: EEE, XP010559179, Published in: New York, NY / USA.

* cited by examiner

TRANSFORMER BASED VOLTAGE COMBINER WITH INDUCTIVE SHUNT

FIELD OF THE INVENTION

The present invention relates to a combiner for combining signals, preferably for combining an AC signal with a DC signal. The invention is concerned particularly, but not exclusively, with modulatable power supplies including a combiner implemented as a transformer.

BACKGROUND TO THE INVENTION

Transistor amplifiers have a peak efficiency for a particular input power that is a function of geometry (i.e. circuit components and layout), load and supply voltage. In conventional radio frequency (RF) power amplification these characteristics are fixed based on the peak input level expected. For amplifiers presented with an input signal having a wide dynamic range, the input signal infrequently achieves peak levels and frequently operates below peak levels. As such, the amplifier may exhibit low overall efficiency.

Various techniques are known in the art for enhancing amplifier efficiency based on the supply voltage. One broad classification of solution is envelope tracking.

In a prior art envelope tracking technique, a switched mode pulse width variable modulator may be combined with a linear amplifier such that the efficient switched mode supply provides the low frequency components of the output signal that contains a majority of the required power, and the linear amplifier provides a high bandwidth signal to provide the high frequency components of the output signal and correct errors in the switched supply output. A power supply with high bandwidth and good efficiency is thereby provided.

GB 2409115 describes an example of such a prior art envelope tracking power supply. A schematic representation of the described power supply is illustrated in FIG. 1. In general, the outputs from a switch mode supply and a linear amplifier are summed in a transformer in order to provide the required voltage to a load. The power supply, generally designated by reference numeral 100, comprises a switchable main voltage source 102 coupled to a first tap 103 of a secondary winding 110 of a transformer 104. A second tap 105 of the secondary winding 110 is coupled to a load 101a. A reference voltage source 114 is provided which is coupled to a first input of a subtractor 112, the subtractor 112 having a second input coupled to the second tap 105 of the secondary winding 110. An output of the subtractor 112 is coupled to an input of a correction amplifier, or driver, 106. The output of the correction amplifier 106 is coupled to a first tap 107 of a primary winding 108 of the transformer 104. A second tap 109 of the primary winding 108 is coupled to ground.

In operation, the switchable main voltage source 102 provides a coarse voltage signal for delivery to the load. Typically this is provided by a selection of one of a plurality of voltage supplies in dependence on a reference voltage source derived from the same origin as the reference voltage source 114.

Subtractor 112 determines an error value between the required voltage, as provided by the reference voltage source 114, and the actual output voltage being provided to the load 101a. The correction amplifier 106 receives this error value and provides an error correction signal at its output which is applied to the primary winding 108 to be summed with the output of the switchable main voltage source 102 passing through the secondary winding 104.

The output voltage provided at tap 105 of the secondary winding is therefore the coarse voltage provided by the switchable main voltage source 102 combined with an error voltage provided by the subtractor/driver 112/106. The transformer 104 performs the combining. The use of a transformer to perform the combining is advantageous and desirable.

However, the coarse voltage signal output by the switchable main voltage source 102 may include a significant DC component which will flow through the secondary winding 110 of the transformer 104. DC current flowing in the transformer windings may result in saturation of the core, with a consequent loss of magnetising inductance, which is clearly undesirable.

One possible way to avoid saturation of the core due to a DC current present in one of the transformer windings is to increase the size of the core, and thereby increase the amount of magnetic flux in the core before it becomes saturated. However, increasing core size increases the transformer leakage inductance and reduces the high frequency response of the transformer and in turn, reduces the high frequency response of the power supply.

An alternative technique for avoiding saturation is to introduce an airgap in the core, but this increases the number of turns required to achieve a given low frequency performance and indirectly increases the leakage inductance, and again reduces the high frequency response of the supply.

A further method of avoiding core saturation is described in GB 2409115. The solution proposed is to inject a DC current into the primary winding 108 of the transformer 104 in such a way as to cancel the flux due to the secondary current. However, this requires control systems to monitor the currents in both the secondary and primary windings of the transformer, and is complex and difficult to control.

It is an aim of the present invention to provide an improved scheme which addresses one or more of the above-stated problems in particular it is an aim of the invention to provide a scheme for reducing DC current in a transformer used as a combiner to combine a DC and an AC signal.

SUMMARY OF THE INVENTION

In accordance with the invention there is provided an apparatus comprising: a transformer comprising at least one winding, wherein said at least one winding has a first tap and a second tap; and an inductor having a first terminal coupled to said first tap, and a second terminal coupled to said second tap.

The at least one winding is one of a plurality of transformer windings. Preferably the at least one winding is one of two transformer windings.

The apparatus may further comprise means for redirecting a DC current to flow through said inductor, said means for directing DC current being arranged between said first tap and said first terminal of the inductor.

Said means for redirecting a DC current may comprise a resistor. The resistor may have a resistance value greater than the resistance value of the inductor. The means for redirecting a DC current may further comprise a capacitor arranged in parallel with said resistor. The capacitor allows AC current to bypass said resistor. This is achieved by the low impedance path offered by the capacitor.

Said transformer may comprise at least a primary winding and a secondary winding, and wherein said transformer is configured as a voltage combiner. A first voltage may be connected between first and second taps of said primary winding. A second voltage may be connected to a first tap of said secondary winding, said second voltage comprising a DC component, and wherein said at least one winding comprises said secondary winding. An output voltage being the combined first and second voltages may be provided on a second tap of said secondary winding.

The second voltage may be a coarse voltage signal. The first voltage may be a fine voltage signal representative of an error in the coarse voltage signal.

A power supply may include the stated apparatus. Said power supply may be configured to provide a modulated supply voltage to a power amplifier.

In accordance with the invention there is also provided a voltage combiner comprising: a transformer having a first and second winding each having a first and second tap; and an inductor connected between the first and second taps of the second winding, wherein: the first tap of the first winding is adapted for connection to a first voltage, the first tap of the second winding is adapted for connection to a second voltage, and the second tap of the second winding is adapted to provide an output being the first and second voltages combined, and further wherein: the inductor is adapted to provide a bypass path for the current associated with the second voltage.

The voltage combiner may further include means for directing the DC current to the bypass path. Said means may be a resistor connected between the first tap and the inductor. Said means may further include a capacitor in parallel with the resistor to provide a low resistance path for AC current in the second voltage.

The ratio of the resistance value of the resistor and the resistance value of the inductor may determine the DC current flow in the inductor. The ratio may be very much greater than 1.

The first voltage may be provided by a switchable voltage source and the second voltage is provided by subtracting the output voltage from a reference voltage.

In accordance with the invention there is also provided a method of reducing DC current in a winding of a transformer, the method comprising: applying a voltage including a DC component to a first tap of the winding; and providing an inductor coupled between the first tap and a second tap of the winding; wherein a proportion of the DC component of the voltage is bypassed around the transformer through said inductor.

The method may further comprise controlling the proportion of the DC component that is bypassed around the transformer by providing a resistive element coupled between the first tap.

BRIEF DESCRIPTION OF THE DRAWINGS

The present invention in now described by way of example with reference to the accompanying Figures, in which:—

DESCRIPTION OF PREFERRED EMBODIMENTS

Figure 1:
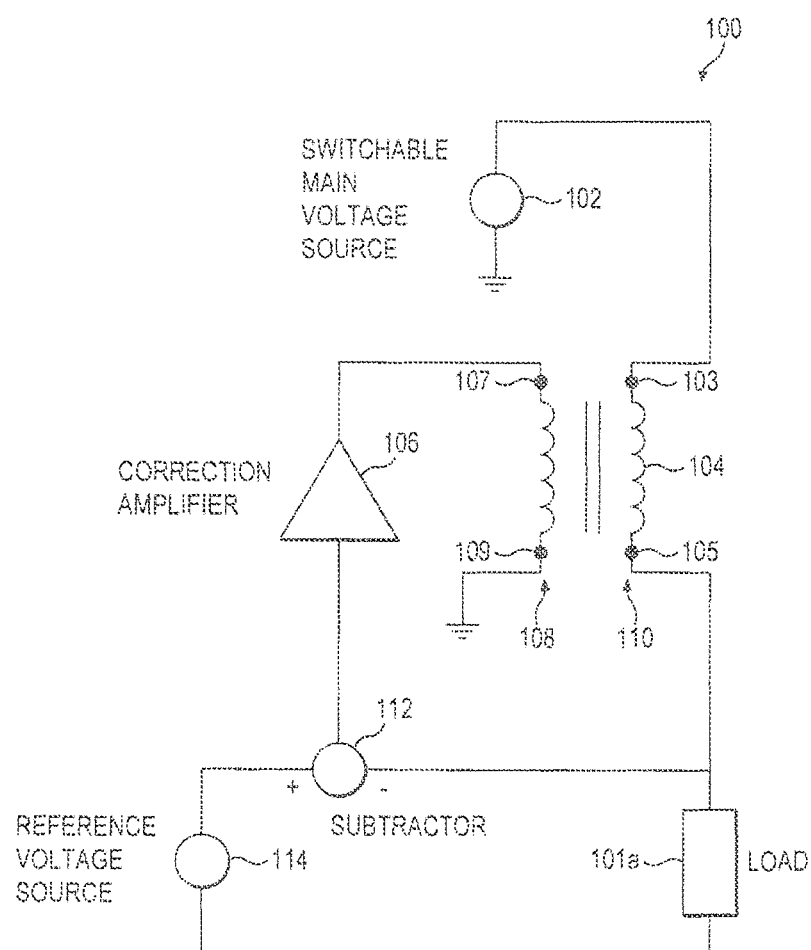
FIG. 1 illustrates a prior art transformer based voltage supply of GB 2409115.

The present invention is described herein by way of particular examples and specifically with reference to a preferred embodiment. It will be understood by one skilled in the art that the invention is not limited to the details of the specific embodiments given herein. In particular the invention is described herein by way of reference to the provision of a power supply for an RF amplification stage. However more generally the invention may apply to any arrangement where it is necessary to reduce DC current in a transformer winding, and particularly in a transformer in which an AC signal and a DC signal are combined.

It should be noted that where the same reference numerals are used in different Figures, they refer to the same elements.

Figure 2A:
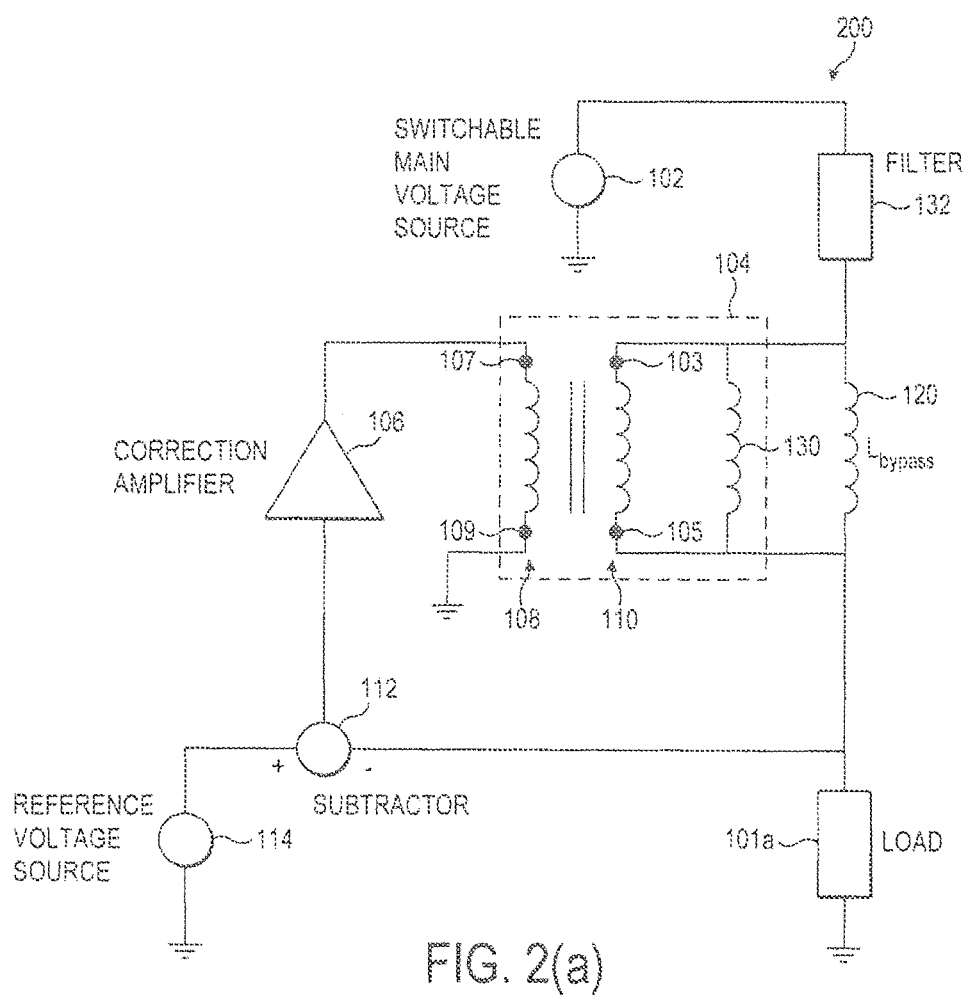
FIGS. 2a and 2b illustrate a transformer based voltage supply with bypass inductor in accordance with an embodiment of the invention.

Referring to FIG. 2a, there is illustrated a transformer based power supply 200 which may be used for modulating the power supplied to a power amplifier in an envelope tracking system, in accordance with the general principles of the present invention. The power supply 200 comprises a switchable main voltage source 102, a transformer 104 having primary 108 and secondary 110 windings, a correction amplifier 106, a subtractor 112, a reference voltage source 114, and a bypass inductor 120.

The switchable main voltage source 102 is coupled a first tap 103 of the secondary winding 110 of transformer 104. A second tap of the secondary winding 110 is coupled to the load 101a. Bypass inductor 120 has first and second terminals, the first terminal being coupled to the first tap 103 of the secondary winding 110, and the second terminal coupled to the second tap 105 of the secondary winding 110. The reference voltage source 114 is coupled to the first input of the subtractor 112, the subtractor 112 having a second input coupled to the second tap 105 of the secondary winding 110. The output of the subtractor 112 is coupled to the input of the correction amplifier 106. The output of correction amplifier 106 is coupled to the first tap 107 of the primary winding 108 of the transformer 104, and the second tap 109 of the primary winding 108 is coupled to ground. The load 101 is coupled between the second tap 105 of the secondary winding 110 and ground.

The transformer 104 of FIG. 2a is shown as an ideal transformer plus an n inductor 130 which represents the magnetising inductance of the transformer. This inductance is present in parallel with the secondary winding 110. The magnetising inductance stores energy in the core of the transformer.

Power supply 200 may optionally comprise filter 132 coupled in series between the switchable main voltage source 102 and the first tap 103 of the secondary winding 110, such that the main voltage is delivered to the transformer via the filter 132.

Figure 2B:
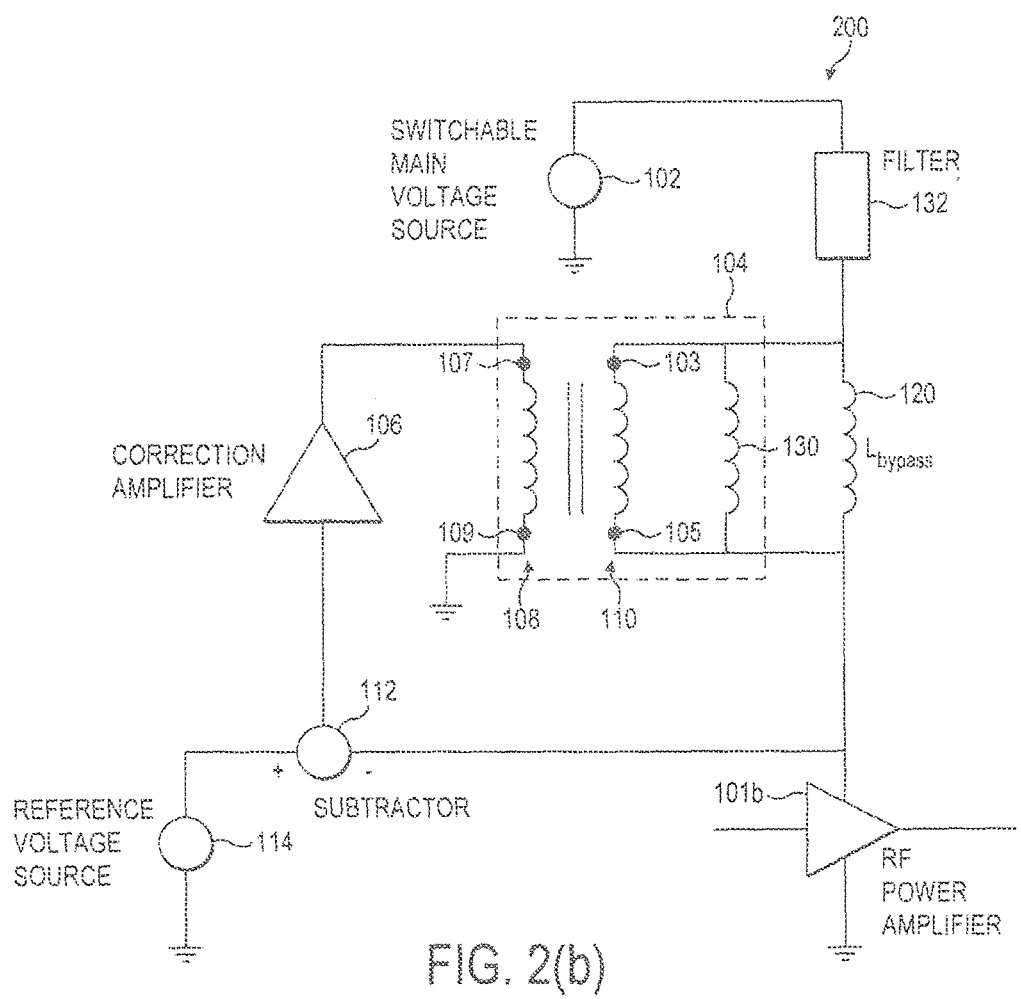

The power supply stage 200 of FIG. 2a provides a modulated output voltage supply to the load 101a. The load 101 may, for example, comprise a RF power amplifier 101b as shown in FIG. 2b. The switchable main voltage source provides a coarse power supply signal that comprises the DC and low frequency components of the required voltage to be delivered to the load 101a. The output of the voltage source 102 may be low pass filtered by filter 132 to remove unwanted high frequency components from the DC and low frequency voltage signal that would otherwise need to be corrected. The output of the voltage source 102 is then applied to the first tap 103 of the secondary winding and the first terminal of the bypass inductor 120. The subtractor 112 receives the reference voltage value and subtracts the value of the voltage present at the second tap 105 of the secondary winding 110 to produce a voltage error signal. This voltage error signal is then amplified in the correction amplifier 108 and applied to the first tap 107 of the primary winding 108. The outputs of the voltage source 102 and the correction amplifier 106 are then combined by the transformer to provide a corrected voltage output at the second tap 105 of the secondary winding 110.

Figure 4:
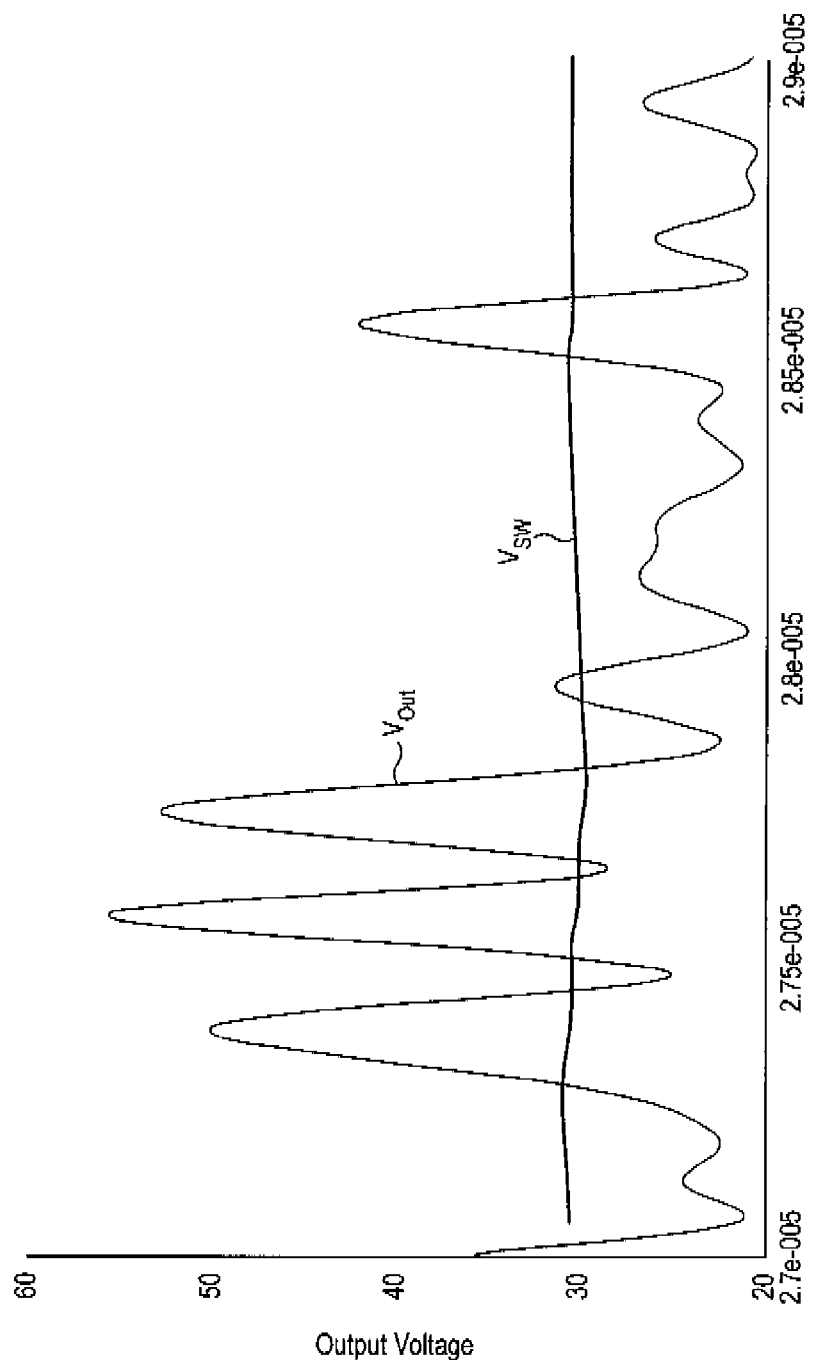
FIG. 4 illustrates output voltage versus time characteristics for a transformer based supply embodying the principles of the present invention.

The contribution of the voltage source 102 to the output voltage of power supply 200 is illustrated in FIG. 4. The voltage output by voltage source 102, $V_{sw}$, is relatively constant for the time period shown in FIG. 4, as would be expected for the DC and low frequency components. In contrast, the corrected output voltage of power supply 200, $V_{out}$, is seen to vary significantly at a much higher frequency. The difference between $V_{sw}$ and $V_{out}$ is provided by the correction amplifier 106 as described above. In the prior art power supply 100, the coarse voltage signal, $V_{sw}$, is applied to the secondary winding 110 of the transformer, and may cause a significant DC current to flow in the secondary winding. This DC current may generate a significant magnetic flux in the transformer core, and may lead to magnetic saturation of the core.

In order to address this problem, the voltage supply stage 200 of FIG. 2a is provided with the bypass inductor 120. The bypass inductor 120 preferably comprises a high power inductor and therefore presents a high impedance to high frequency signals, but a very low impedance to DC current and low frequency signals. Therefore, the bypass inductor presents a low impedance DC current bypass path around the transformer, and a proportion of the DC current output by voltage source 102 will flow through the bypass inductor and not through the transformer. The flux in the transformer core due to the DC current flowing through the transformer windings will be reduced as less DC current flows through the secondary winding 110. Thus, the susceptibility of the core to magnetic saturation is reduced. This allows a physically smaller transformer, compared with the transformer that would be required in the prior art power supply 100 of FIG. 1. This is advantageous as a smaller transformer may have an improved high frequency response.

Figure 3:
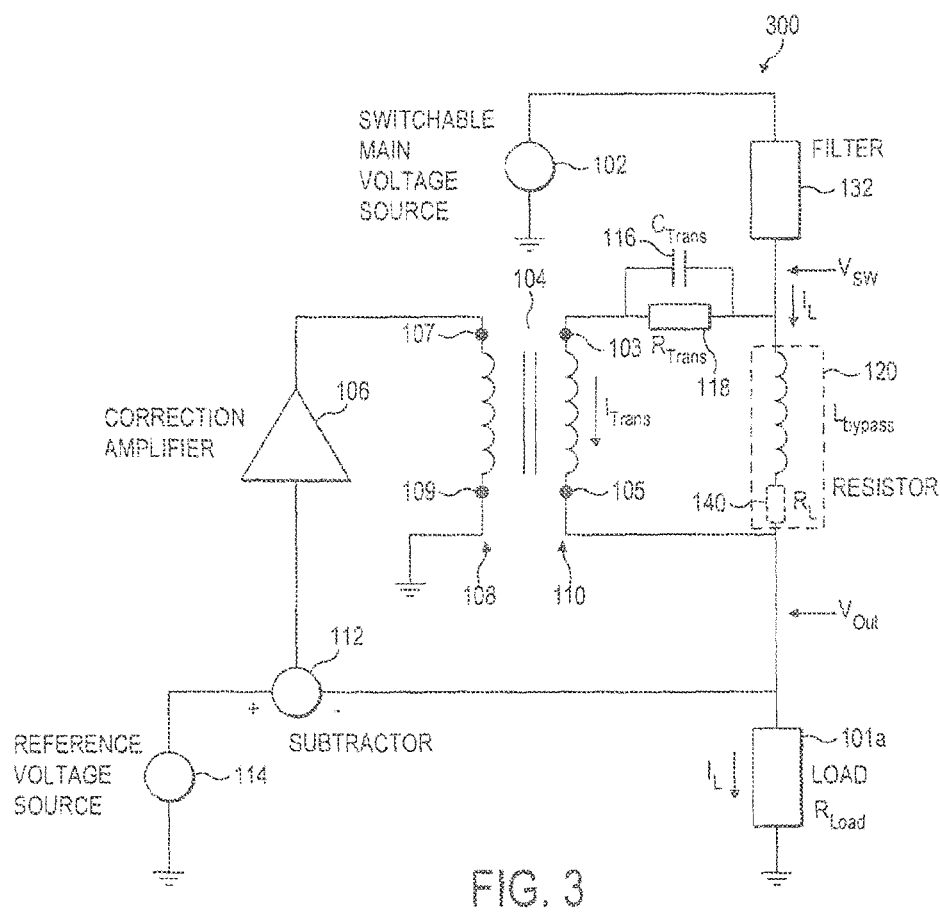
FIG. 3 illustrates a transformer based voltage supply with a DC steering resistor in accordance with an embodiment of the invention.

Referring to FIG. 3, a further embodiment of the present invention is illustrated. The transformer based supply 300 shown in FIG. 3 is similar to that shown in FIG. 2, but further comprises a resistor 118 and a capacitor 116.

In the embodiment of FIG. 3, the voltage source 102 is coupled to the first terminal of the bypass inductor 120. Resistor 118 is coupled between the first tap 103 of the secondary winding 110 and the first terminal of the bypass inductor 120. The capacitor 116 is arranged in parallel with the resistor 118, between the bypass inductor 120 and the secondary winding 110. The remaining components and connections are identical to those described in conjunction with FIG. 2.

Bypass inductor 120 has an associated resistance value, $R_L$, due to the length of wire in the inductor coil. This resistance value is represented in FIG. 3 by resistor 140 connected between the second terminal of the inductor 120 and the load 101a. This resistance value $R_L$ is normally small. The resistor 118 has a resistance value $R_{trans}$ that is greater than $R_L$, preferably much greater. Therefore, DC current output by the voltage source 102 will flow preferentially through the low resistance path provided by bypass inductor 120, with its inherent low resistance, $R_L$. The ratio of $R_{trans}$ to $R_L$ determines the reduction in DC current flowing in the transformer secondary 110 and hence the reduction in the DC magnetic flux in the transformer 104.

The resistor 118 thus provides a means for directing current through the bypass path rather than through the transformer.

The capacitor 116 provides a low impedance path for AC current flow through the secondary winding 110 of the transformer 104. By providing a low impedance path for AC currents, excessive dissipation of high frequency signals in resistor 118 may be avoided.

Thus, in the exemplary embodiment described in relation to FIG. 3, it is possible to control the proportion of the DC current that is bypassed around the transformer 104 via the bypass inductor 120. By increasing $R_{trans}$ in relation to $R_L$ a greater proportion of the DC current is directed through the bypass inductor 120, further reducing the magnetic flux and stored energy in the transformer as compared to the embodiment shown in FIG. 2a. As the flux in the transformer is further reduced, the transformer itself may be further reduced in size whilst avoiding magnetic saturation of the core.

The presence of bypass inductor 120 in the power supply stage 200 or 300 of FIGS. 2a and 3 may provide further benefits as will now be discussed in relation to FIG. 5.

Assuming a lossless transformer, the average power delivered to the load 101a is the combination of the average power delivered by the switchable main voltage source 102 and the correction amplifier 106. However, the instantaneous power delivered to the load 101a may not be equal to the sum of the instantaneous power delivered by the switchable main voltage source 102 and the correction amplifier 106. This is because energy is stored in the bypass inductor 120 and in the transformer magnetising inductance 105 and this energy may be released during periods of high instantaneous output power.

Figure 5:
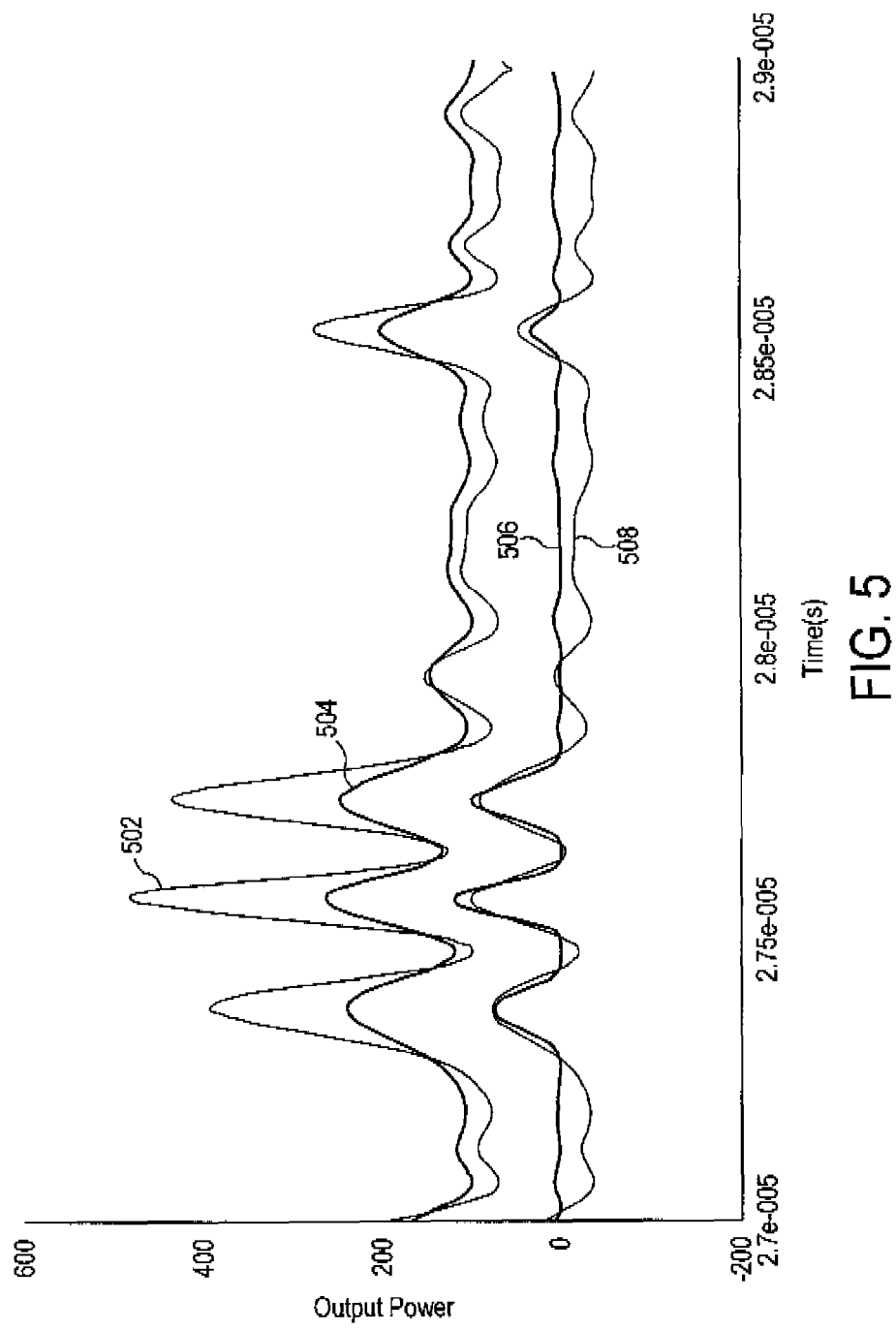
FIG. 5 illustrates output power versus time characteristics for a transformer based supply embodying the principles of the present invention.

FIG. 5 shows as waveform 502 the total output power ($P_{TOT}$) of the transformer based power supply 200 or 300 delivered to the load. FIG. 5 also shows: as waveform 504 the power ($P_{SW}$) delivered to the load by the switched main voltage source 102; as waveform 506 the power ($P_{CORR}$) delivered by the correction amplifier 106; and as waveform 508 the power ($P_{IND}$) delivered by the bypass inductor 120. It will be understood that $P_{TOT}=P_{IND}+P_{SW}+P_{CORR}$.

As can be seen from FIG. 5, the majority of the power being delivered to the load at any one point in time is provided by the switchable main voltage source 102. However, during peaks in output power, a significant amount of power is provided by the bypass inductor 120.

The average power output of the (ideal) bypass inductor must be zero, in order for energy to be conserved. As can be seen in FIG. 5, the inductor 120 is 'charged' during periods of low instantaneous output power, and releases the stored-energy during periods of high instantaneous output power. Advantageously, this significantly reduces the peak power requirement of the correction amplifier 106.

In order to improve the high frequency response of the power supply 200, it is preferable to use a small transformer, as smaller transformers are known to have better high frequency responses.

The provision of bypass inductor 120 enables the high frequency performance of a small transformer to be enjoyed without experiencing transformer saturation due to DC current flowing through the transformer secondary winding.

Thus, embodiments of the present invention may allow the DC and low frequency components supplied by the switchable main voltage source 102 to be diverted to flow predominantly through the bypass inductor 120, and thereby reduce the DC current flowing through the transformer. By reducing the DC current flowing through the transformer 104, the magnetic flux in the core is reduced, allowing a smaller transformer to be used without allowing the core to become saturated, and thereby improving the high-frequency performance of the power supply 200.

Energy which would otherwise be stored in the magnetising inductance 105 of the transformer 104 is instead stored in a physically separate inductor 120, which unlike the transformer 104, does not need to be optimised for high frequency operation. As the inductor 120 does not need to be optimised for high frequency operation a large inductance may be preferred. The stored energy may then be delivered to the load 101 during periods of high instantaneous output power, thereby reducing the peak power requirement of the correction amplifier 106.

The present invention has been described herein by way of reference to particular preferred embodiments. However, the invention is not limited to such embodiments. The present invention has particular application in relation to RF amplifiers, but is not limited to such implementation. The invention can be advantageously utilised in any environment in which a transformer winding is required to carry a DC current that could lead to magnetic saturation of the transformer core.

The described preferred embodiments utilising an RF amplifier are not limited to any particular load being driven by such RF amplifier. However it is envisaged that such an RF amplifier will typically drive an antenna. As such, the present invention has particular advantageous uses in the field of communications, including the field of mobile communications.

What is claimed is:

1. An apparatus comprising:
   a transformer comprising at least one winding, wherein said at least one winding has a first tap and a second tap, and having a magnetizing inductance; and
   a bypass inductor having a first terminal coupled to said first tap, and a second terminal coupled to said second tap, and providing a bypass path around the transformer.

2. The apparatus of claim 1, further comprising means for redirecting a DC current to flow through said inductor, said means for directing DC current being arranged between said first tap and said first terminal of the inductor.

3. The apparatus of claim 2, wherein said means for redirecting a DC current comprises a resistor.

4. The apparatus of claim 3, wherein the resistor has a resistance value greater than the resistance value of the inductor.

5. The apparatus according to claim 3 wherein the means for redirecting a DC current further comprises a capacitor arranged in parallel with said resistor.

6. The apparatus of claim 1, wherein said transformer comprises at least a primary winding and a secondary winding, and wherein said transformer is configured as a voltage combiner.

7. The apparatus of claim 6, wherein a first voltage is connected between first and second taps of said primary winding.

8. The apparatus of claim 7, wherein a second voltage is connected to a first tap of said secondary winding, said second voltage comprising a DC component, and wherein said at least one winding comprises said secondary winding.

9. The apparatus of claim 6, wherein an output voltage being the combined first and second voltages is provided on a second tap of said secondary winding.

10. The apparatus of claim 9, wherein the second voltage is a coarse voltage signal.

11. The apparatus of claim 10, wherein the first voltage is a fine voltage signal representative of an error in the coarse voltage signal.

12. A power supply including the apparatus of claim 1.

13. The power supply of claim 12, wherein said power supply is configured to provide a modulated supply voltage to a power amplifier.

14. A voltage combiner comprising:
   a transformer having a first and second winding each having a first and second tap, and having a magnetizing inductance; and
   a bypass inductor connected between the first and second taps of the second winding,
   wherein:
   the first tap of the first winding is adapted for connection to a first voltage, the first tap of the second winding is adapted for connection to a second voltage, and the second tap of the second winding is adapted to provide an output being the first and second voltages combined, and further wherein:
   the bypass inductor is adapted to provide a bypass path for the current associated with the second voltage.

15. The voltage combiner of claim 14 further including a resistor connected between the first tap and the inductor for directing the DC current to the bypass path.

16. The voltage combiner of claim 15 further including a capacitor in parallel with the resistor to provide a low resistance path for AC current in the second voltage.

17. The voltage combiner of claim 16 wherein the second voltage is provided by a switchable voltage source and the first voltage is provided by subtracting the output voltage from a reference voltage.

18. The voltage combiner of claim 16 wherein the ratio of the resistance value of the resistor and the resistance value of the inductor determines the DC current flow in the inductor.

19. A method of reducing DC current in a winding of a transformer having a magnetizing inductance, the method comprising:
   applying a voltage including a DC component to a first tap of the winding; and
   providing a bypass inductor coupled between the first tap and a second tap of the winding;
   wherein a proportion of the DC component of the voltage is bypassed around the transformer through said bypass inductor.

20. The method of claim 19, further comprising controlling the proportion of the DC component that is bypassed around the transformer by providing a resistive element coupled between the first tap.

* * * * *

UNITED STATES PATENT AND TRADEMARK OFFICE
CERTIFICATE OF CORRECTION

PATENT NO.        : 8,669,745 B2                                          Page 1 of 1
APPLICATION NO.   : 12/919668
DATED             : March 11, 2014
INVENTOR(S)       : Gerard Wimpenny It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 726 days.

Signed and Sealed this

Twenty-ninth Day of September, 2015

Michelle K. Lee
*Director of the United States Patent and Trademark Office*